US008851621B2

(12) United States Patent
Sato et al.

(10) Patent No.: US 8,851,621 B2
(45) Date of Patent: Oct. 7, 2014

(54) LIQUID EJECTING HEAD AND LIQUID EJECTING APPARATUS

(71) Applicant: Seiko Epson Corporation, Tokyo (JP)

(72) Inventors: Masahiko Sato, Shiojiri (JP); Munehide Kanaya, Azumino (JP); Toshinobu Yamazaki, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/850,491

(22) Filed: Mar. 26, 2013

(65) Prior Publication Data

US 2013/0258001 A1 Oct. 3, 2013

(30) Foreign Application Priority Data

Mar. 28, 2012 (JP) ................................ 2012-074300

(51) Int. Cl.
*B41J 2/015* (2006.01)
*H05K 1/00* (2006.01)
*B41J 2/14* (2006.01)

(52) U.S. Cl.
CPC .................................. *B41J 2/14201* (2013.01)
USPC ............................................ 347/20; 174/259

(58) Field of Classification Search
None
See application file for complete search history.

(56) References Cited

U.S. PATENT DOCUMENTS

2009/0201346 A1 8/2009 Miyata et al.
2011/0067912 A1* 3/2011 Nomura et al. ............... 174/261
2011/0273518 A1* 11/2011 Sato et al. ....................... 347/70

FOREIGN PATENT DOCUMENTS

JP 2009208462 A 9/2009

* cited by examiner

*Primary Examiner* — Matthew Luu
*Assistant Examiner* — Erica Lin
(74) *Attorney, Agent, or Firm* — Harness, Dickey & Pierce, P.L.C.

(57) ABSTRACT

A liquid ejecting head has a flow channel substrate, an actuator formed on the flow channel substrate and having at least one mount, and a flexible wiring substrate electrically connected to the mount to supply a drive signal to the actuator. The mount of the actuator and the wiring substrate are bonded together using an epoxy adhesive agent containing p-aminophenol epoxy resin, bisphenol A epoxy resin, and bisphenol F epoxy resin.

8 Claims, 4 Drawing Sheets

LIQUID EJECTING HEAD AND LIQUID EJECTING APPARATUS

BACKGROUND

1. Technical Field

The present invention relates to a liquid ejecting head and a liquid ejecting apparatus that eject liquid through nozzle openings.

2. Related Art

A known form of liquid ejecting heads, which are mechanical components that can discharge liquid, is an ink jet recording head. An ink jet recording head has nozzle openings, and these nozzle openings communicate with pressure chambers formed on either side of a flow channel substrate. There are also piezoelectric elements on this side of the flow channel substrate, and the piezoelectric elements are displaced to change the pressure in appropriate pressure chambers, whereby ink droplets are discharged from appropriate nozzle openings.

Regarding such ink jet recording heads, the use of a COF substrate to supply a drive signal to more than one piezoelectric element has been proposed (e.g., see JP-A-2009-208462).

Although such a form of connection using a COF substrate has been proposed as in the above publication, this connection method can be disadvantageous when the piezoelectric elements are arranged in more than one line and the COF substrate is bonded to the piezoelectric elements with an anisotropic conductive adhesive agent since the obtained recording head may lose electrical continuity during long-term use.

This type of problem is not unique to ink jet recording heads; similar problems may be encountered with liquid ejecting heads used with any kind of liquid other than ink.

SUMMARY

An advantage of some aspects of the invention is that they provide a liquid ejecting head satisfactorily durable and offering complete electrical continuity between the wiring substrate and the actuator used therein and a liquid ejecting apparatus advantageous in the same way.

To solve the problems described above, an aspect of the invention provides a liquid ejecting head having a flow channel substrate, an actuator formed on the flow channel substrate and having at least one mount, and a flexible wiring substrate electrically connected to the mount to supply a drive signal to the actuator. The mount of the actuator and the wiring substrate are bonded together using an epoxy adhesive agent containing p-aminophenol epoxy resin, bisphenol A epoxy resin, and bisphenol F epoxy resin.

In this aspect, the flow channel substrate and the wiring substrate are joined using a predetermined combination of epoxy resins. The adhesive agent is unlikely to swell even when the liquid the head ejects comes into contact therewith. The ink jet recording head can therefore operate without losing electrical continuity for a long period of time.

Preferably, the epoxy adhesive agent contains 5 to 25% by mass of p-aminophenol epoxy resin, 2 to 15% by mass of bisphenol A epoxy resin, 30 to 50% by mass of bisphenol F epoxy resin, and a hardener. This makes it more certain that the adhesive agent will be prevented from swelling and the ink jet recording head can operate without losing electrical continuity for a long period of time.

It is also preferred that the epoxy adhesive agent is an anisotropic conductive material that exhibits anisotropic conductivity owing to a particulate conductor contained therein.

Such a material is unlikely to swell even when the liquid the head ejects comes into contact therewith, and therefore the ink jet recording head can operate without losing electrical continuity for a long period of time. In addition to this, using such a material as adhesive agent makes it easier to electrically connect the wiring substrate to the mount.

Another aspect of the invention provides a liquid ejecting apparatus having the liquid ejecting head according to the above aspect.

The liquid ejecting apparatus according to this aspect can operate without losing electrical continuity for a long period of time because the adhesive agent used therein is unlikely to swell even when the liquid the apparatus ejects comes into contact therewith.

BRIEF DESCRIPTION OF THE DRAWINGS

The invention will be described with reference to the accompanying drawings, wherein like numbers reference like elements.

DESCRIPTION OF EXEMPLARY EMBODIMENTS

The following details an embodiment of the invention with reference to the accompanying drawings.

Figure 1:
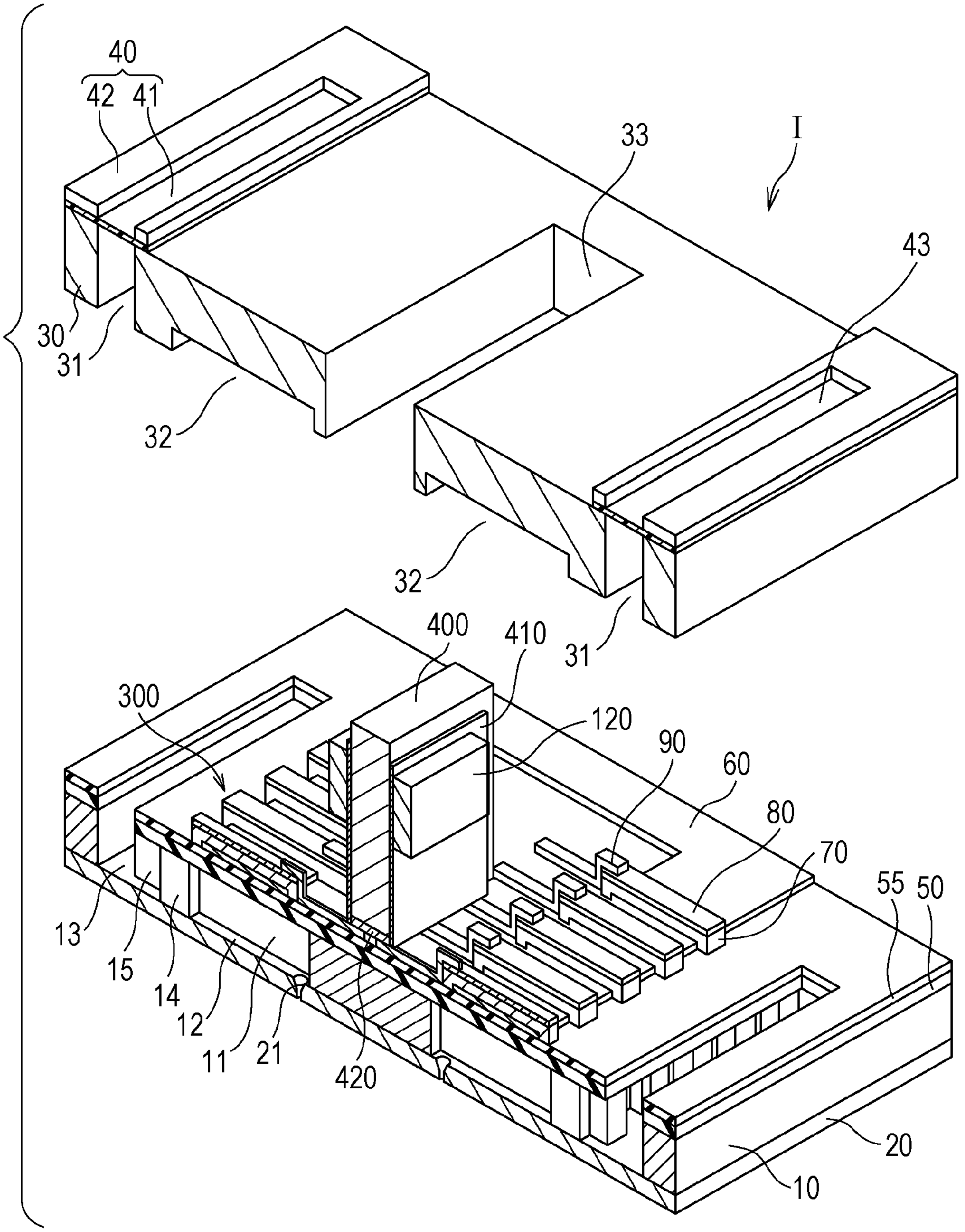
FIG. 1 is an exploded perspective diagram illustrating a recording head according to Embodiment 1.
Figure 2A:
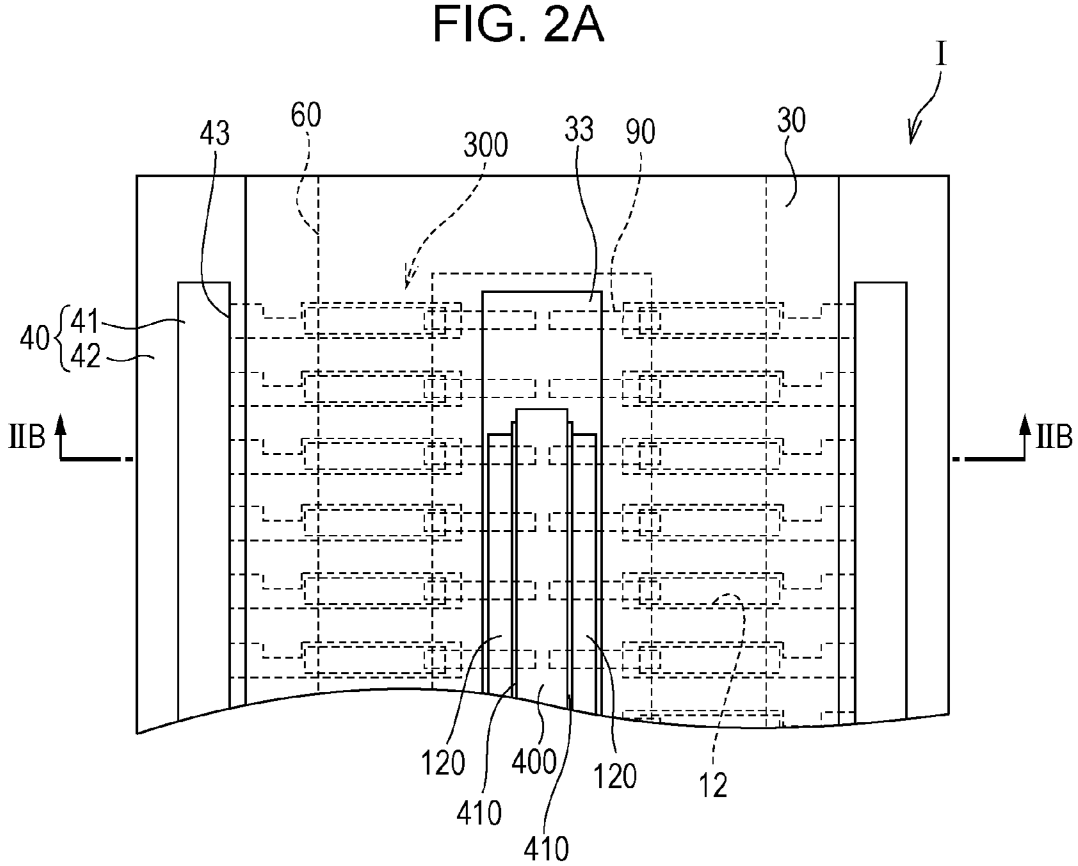
FIGS. 2A and 2B are a plan view and a cross-sectional view of the recording head according to Embodiment 1, respectively.
Figure 2B:
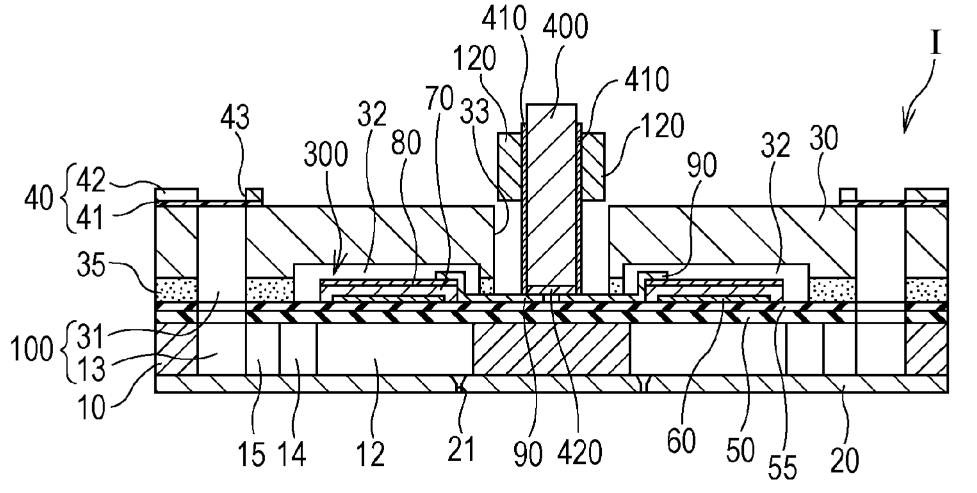

FIG. 1 is an exploded perspective diagram schematically illustrating the constitution of an ink jet recording head as an example of the liquid ejecting head according to Embodiment 1 of the invention. FIGS. 2A and 2B are a plan view of FIG. 1 and a cross-sectional view taken along line IIB-IIB of this plan view, respectively.

As illustrated in these drawings, the flow channel substrate 10, which is a (110)-oriented silicon single crystal substrate in this embodiment, is covered on either side with an elastic film 50, which is made of silicon dioxide.

The flow channel substrate 10 has two rows of parallel (side by side) arranged pressure chambers 12. There are two communicating spaces 13 each formed in the region outside with respect to the longitudinal direction, which is perpendicular to the direction of arrangement of the pressure chambers 12 in each row, and each communicating space 13 communicates with the corresponding set of pressure chambers 12 via ink supply paths 14 and communicating paths 15 formed for the respective pressure chambers 12. Each communicating space 13 also communicates with one reservoir portion 31 of a protective substrate 30 (described later herein) to form a reservoir 100, a common ink tank for each row of the pressure chambers 12. The ink supply paths 14 are narrower in width than the pressure chambers 12 so as to maintain a constant resistance to the flow of ink from the communicating spaces 13 into the pressure chambers 12. Although in this embodiment the ink supply paths 14 are formed by narrowing each branch of the flow channel from one lateral side, it is also possible to form ink supply paths by narrowing each branch of the flow channel from both lateral sides. It is also allowed to form ink supply paths by reducing the height of each branch of the flow channel instead of the width. The communicating paths 15 on each side are formed by extending both lateral walls 11 of the pressure chambers 12 toward the communicating space 13 to divide the space between the ink supply paths 14 and the communicating space 13. In summary, the flow channel substrate 10 contains ink supply paths 14 having a smaller lateral cross-sectional area than the pressure chambers 12 and also contains communicating paths 15 communicating with the ink supply paths 14 and having a larger lateral cross-sectional area than the ink supply paths 14, and each pair of paths is isolated from other pairs by walls 11.

To the opening side of the flow channel substrate 10 a nozzle plate 20, which is drilled in advance to have nozzle openings 21 leading to the extremity of the pressure chambers 12 opposite to the ink supply paths 14, is bonded with an adhesive agent, hot-melt film, or some other adhesive material. In this embodiment, the flow channel substrate 10 has two rows of pressure chambers 12 as described above; thus, one ink jet recording head I has two nozzle rows, each formed by nozzle openings 21. Examples of materials used to make the nozzle plate 20 include glass ceramics, a silicon single crystal substrate, and stainless steel.

As described above, there is an elastic film 50 on the side of the flow channel substrate 10 opposite to the opening side. This elastic film 50 is covered with an insulating film 55. On this insulating film 55, a first electrode film 60, a piezoelectric layer 70, and a second electrode film 80 are stacked by the process described later herein to form piezoelectric elements 300. Each piezoelectric element 300 is a unit including the first electrode film 60, the piezoelectric layer 70, and the second electrode film 80. Usually, either of the two electrodes of the piezoelectric elements 300 is used as a common electrode, and the other electrode and the piezoelectric layer 70 are patterned to fit the pressure chambers 12. The portion that is formed by the patterned electrode and piezoelectric layer 70 and undergoes piezoelectric strain upon the application of voltage between the two electrodes is referred to as a piezoelectric active component herein. Although in this embodiment the first electrode film 60 serves as a common electrode for the piezoelectric elements 300 and the second electrode film 80 as separate electrodes for the piezoelectric elements 300, this assignment may be reversed due to any driver arrangement or wiring problems. Furthermore, each piezoelectric element 300 and a portion displaced by the operation of the piezoelectric element 300 (a diaphragm) are collectively referred to as an actuator herein. Although in the above constitution the elastic film 50, the insulating film 55, and the first electrode film 60 form diaphragms, this is not the only possible constitution, of course. For example, it is possible that the elastic film 50 and the insulating film 55 are omitted and the first electrode film 60 alone serves as diaphragms. It is also allowed that the piezoelectric elements 300 themselves practically double as diaphragms.

The piezoelectric layer 70 is formed on the first electrode film 60 and made of a piezoelectric material to serve as an electromechanical transducer. The piezoelectric layer 70 is preferably a perovskite-structured crystal film, and examples of preferred materials include lead zirconate titanate (PZT) and other ferroelectric materials as well as their derivatives containing a metal oxide such as niobium oxide, nickel oxide, or magnesium oxide.

To the individual sections of the second electrode film 80, which serve as separate electrodes for the piezoelectric elements 300, lead electrodes 90 made of gold (Au) or a similar material are connected, extending from the extremity of the electrode film sections opposite to the ink supply paths 14 to the insulating film 55. It is also possible that the individual sections of the second electrode film 80 extend to serve as the lead electrodes 90.

The upper surface of the flow channel substrate 10 having the piezoelectric elements 300 formed in such a way as described above, or in other words the first electrode film 60, the insulating film 55, and the lead electrodes 90, is covered with a protective substrate 30, which has reservoir portions 31 serving as at least a component of reservoirs 100 and is bonded using an adhesive agent 35. In this embodiment, the reservoir portion 31 on each side is formed through the entire thickness of the protective substrate 30 and along the direction of the width of the pressure chambers 12 and, as mentioned above, communicates with the corresponding communicating space 13 of the flow channel substrate 10 to form a reservoir 100, a common ink tank for the pressure chambers 12 on that side. It is also possible to divide each communicating space 13 of the flow channel substrate 10 into several portions corresponding to the pressure chambers 12 on the side so that the reservoir portion 31 can solely serve as a reservoir. Other constitutions may also be allowed, including one in which only the pressure chambers 12 are formed in the flow channel substrate 10, and the ink supply paths 14 are formed in the portion between the flow channel substrate 10 and the protective substrate 30 (e.g., the elastic film 50 and the insulating film 55) to ensure the communication between reservoirs and the pressure chambers 12.

The protective substrate 30 further has piezoelectric element housings 32 facing the respective rows of the piezoelectric elements 300 and each having a space large enough to allow the piezoelectric elements 300 to move. It does not matter whether the space each piezoelectric element housing 32 has is tightly sealed or not as long as the space is large enough to allow the piezoelectric elements 300 to move.

Preferably, the protective substrate 30, prepared and used in such a way as described above, is made of a material having a coefficient of thermal expansion equal to or similar to that of the flow channel substrate 10, such as glass or a ceramic material. In this embodiment, it is made of the same material as the flow channel substrate 10, i.e., a silicon single crystal substrate.

The protective substrate 30 additionally has a through-hole 33 formed through the entire thickness of the protective substrate 30. Either extremity of the individual lead electrodes 90 extending from the piezoelectric elements 300 projects into this through-hole 33 to form mounts.

The drivers 120 for activating the piezoelectric elements 300 have already been mounted on wiring COF substrates 410. The COF substrates 410 have been fastened almost upright to the lateral sides of a support 400 with their bottom connected to the lead electrodes 90. In this embodiment, the support 400 is a rectangular parallelepiped having vertical lateral sides. The support 400 is not always necessary; it is possible that the COF substrates 410 are bonded directly to the mount.

In more specific terms, the ink jet recording head I according to this embodiment has two rows of pressure chambers 12 arranged on the flow channel substrate 10 and thus has two rows of piezoelectric elements 300 arranged along the direction of the width of the pressure chambers 12 (the piezoelectric elements 300 arranged side by side). In other words, this ink jet recording head has two facing rows of pressure chambers 12, piezoelectric elements 300, and lead electrodes 90. Two COF substrates 410 are fastened to the lateral sides of the support 400, the bottom of which is in the through-hole 33, and each of the COF substrates 410 is almost upright with its bottom connected to one extremity of the corresponding set of lead electrodes 90. The support 400 is a stainless steel (SUS) member supported at its bottom by a buffer 420, which can preferably be made of Teflon (registered trademark) or the like. The bottom terminals of each COF substrate 410 and the corresponding set of lead electrodes 90 are electrically connected by conductive particles contained in an anisotropic conductive material such as an anisotropic conductive film or anisotropic conductive paste, and the flow channel substrate 10 and the COF substrates 410 are joined using an adhesive agent. In other words, an anisotropic conductive layer is first placed on the lead electrodes 90, the COF substrates 410 fastened to the support 400 are then positioned to match the lead electrodes 90 so that the terminals should face the correct counterparts, and the support 400 is then pressed down so that its bottom surface should press the COF substrates 410 toward the lead electrodes 90. This establishes a predetermined electrical connection between the COF substrates 410 and the lead electrodes 90 via conductive particles. The buffer 420 equalizes the pressure between the COF substrates 410. Of course, the buffer 420 is not a necessary component either.

Compliance substrates 40 each having a sealing film 41 and a stationary plate 42 are also bonded to the protective substrate 30. The sealing film 41 is made of a low-rigidity flexible material (e.g., polyphenylene sulfide [PPS] film), and the corresponding reservoir portion 31 is sealed with this sealing film 41 on either side. The stationary plate 42 is made of a hard material such as metals (e.g., stainless steel [SUS]). This stationary plate 42 has an opening 43 formed through its entire thickness over the area facing the corresponding reservoir 100; one face of each reservoir 100 is sealed with a flexible sealing film 41 only.

Constituted as above, the ink jet recording head according to this embodiment receives ink from an external ink source (not illustrated), fills its inside from the reservoirs 100 to the nozzle openings 21 with the ink, and then, in response to recording signals transmitted from the drivers 120, distributes voltage to the first electrode film 60 and the second electrode film 80 so that the elastic film 50, the insulating film 55, the first electrode film 60, and the piezoelectric layer 70 should undergo flexural deformation at the positions corresponding to appropriate pressure chambers 12. As a result, the selected pressure chambers 12 are pressurized and eject ink droplets through the corresponding nozzle openings 21.

This embodiment provides an easier way to produce ink jet recording heads than wire-bonding processes because in this embodiment COF substrates 410 carrying drivers 120 are used to connect the drivers 120 to the lead electrodes 90 of the piezoelectric elements 300. This embodiment also makes it easy to achieve a high packing density because the COF substrates 410 are almost upright with their bottom connected to the corresponding set of lead electrodes 90. Furthermore, this embodiment allows efficient heat dissipation from the drivers 120 because the drivers 120 are fastened to the lateral sides of the support 400 with the COF substrates 410 interposed.

In an aspect of the invention, the adhesive agent contained in the above-mentioned anisotropic conductive material is a substance prepared with a predetermined formula, or more specifically an epoxy adhesive agent containing p-aminophenol epoxy resin, bisphenol A epoxy resin, and bisphenol F epoxy resin. An epoxy adhesive agent usually contains a base epoxy compound and a hardener. In an aspect of the invention, the base epoxy compound contains p-aminophenol epoxy resin, bisphenol A epoxy resin, and bisphenol F epoxy resin, while the hardener may be of any kind that can effectively harden the base epoxy compound. For example, it is possible to use any suitable hardener selected from aliphatic polyamines, aromatic polyamines, and so forth.

The rationale for using an epoxy adhesive agent formulated as above is the findings that an adhesive agent used to bond the flow channel substrate 10 and the COF substrates 410 described above is exposed to the ink used in the ink jet recording head and swells, breaking the electrical connection between the bottom terminals of the COF substrates 410 and the lead electrodes 90 mediated by conductive particles. In other words, the inventors have found that an adhesive agent used to assemble mounts of this type swells and pushes the COF substrates 410 away from the flow channel substrate 10 after a long period of the exposure to ink associated with evaporation of discharged ink, ink leakage, and other causes, leading to poor electrical continuity.

Figure 3A:
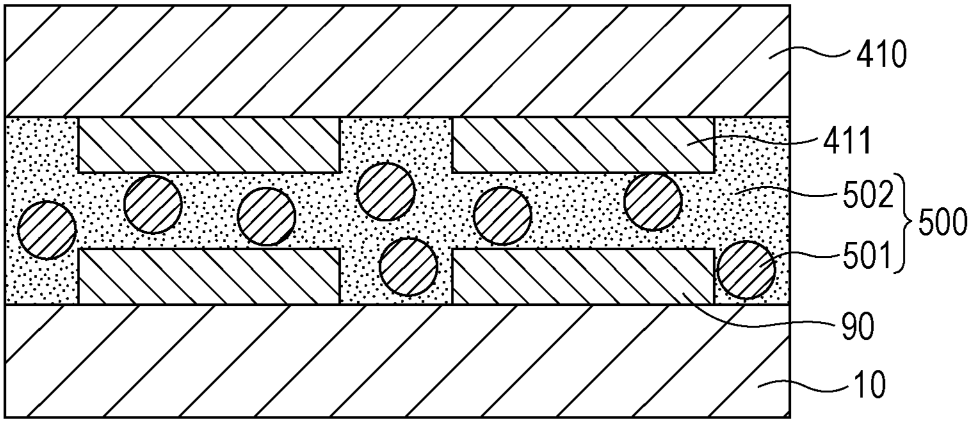
FIGS. 3A to 3C schematically illustrate some states of bonding at a mount.
Figure 3B:
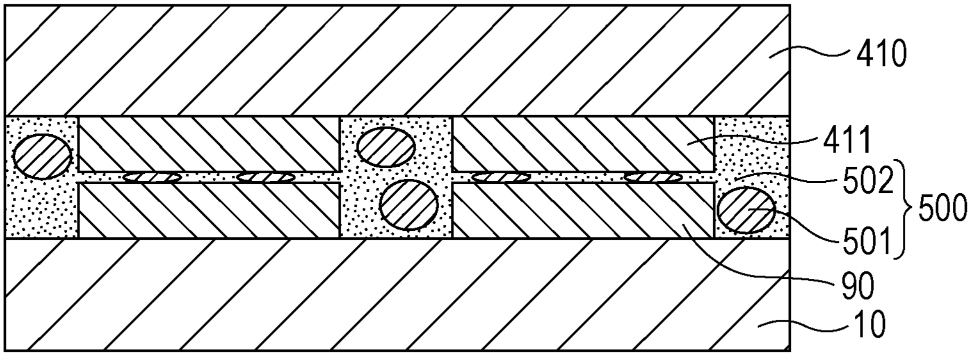
Figure 3C:
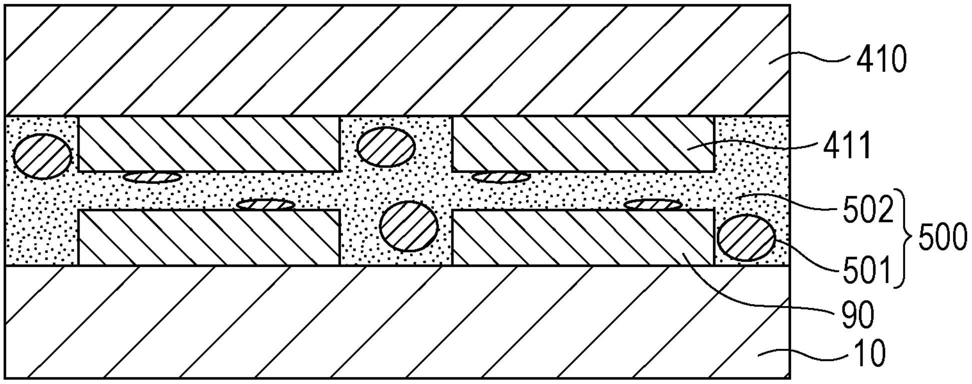

The following describes this problem with reference to FIGS. 3A to 3C, schematic cross-sectional views of some major components of a mount. As illustrated in FIG. 3A, the flow channel substrate 10 and the COF substrate 410 are crimped and heated with an anisotropic conductive material 500 interposed and lead electrodes 90 and terminals 411 facing each other. This makes the lead electrodes 90 and the terminals 411 electrically connected by conductive particles 501 existing in the anisotropic conductive material 500 and also makes the adhesive agent 502 in the anisotropic conductive material 500 between the flow channel substrate 10 and the COF substrate 410 solid to bond these two members together as illustrated in FIG. 3B. After long-term exposure to ink, the ordinary adhesive agent 502 swells, pushing the flow channel substrate 10 and the COF substrate 410 outwards and increasing the distance therebetween as illustrated in FIG. 3C. As a result, the electrical continuity between the lead electrodes 90 and the terminals 411 of the COF substrate 410 is lost.

After various studies, the inventors found that epoxy adhesive agents containing p-aminophenol epoxy resin, bisphenol A epoxy resin, and bisphenol F epoxy resin as ingredients of the base epoxy compound are very unlikely to swell upon exposure to ink and thus are free of this poor electrical continuity issue. In other words, epoxy adhesive agents prepared with such a predetermined formula do not swell to as large a size as illustrated in FIG. 3C even after a long period of exposure to ink and thus can be used without causing poor electrical continuity.

As mentioned above, the adhesive agent contained in the anisotropic conductive material used in an aspect of the invention is an epoxy adhesive agent containing a base epoxy compound and a hardener, and the base epoxy compound contains p-aminophenol epoxy resin, bisphenol A epoxy resin, and bisphenol F epoxy resin. Preferably, the epoxy adhesive agent contains 5 to 25% by mass of p-aminophenol epoxy resin, 2 to 15% by mass of bisphenol A epoxy resin, and 30 to 50% by mass of bisphenol F epoxy resin, 10 to 50% by mass of a hardener, and optionally a filler or any other necessary additives.

Epoxy adhesive agents formulated as above swell in contact with ink but with the swelling ratio reduced to 1/10 or less relative to bisphenol A epoxy resin-based ones (details discussed later herein) and thus are unlikely to cause poor electrical continuity.

A more preferred formula is 5 to 10% by mass of p-aminophenol epoxy resin, 2 to 10% by mass of bisphenol A epoxy resin, and 30 to 50% by mass of bisphenol F epoxy resin and 20 to 40% by mass of a hardener; the swelling ratio of the adhesive agent is further reduced, making it more certain that poor electrical continuity will be prevented.

Although in this embodiment the anisotropic conductive material is composed of the epoxy adhesive agent described above and conductive particles, the combination of epoxy resins according to an aspect of the invention can also be applied when a mount is assembled using an adhesive agent containing no conductive particles, such as non-conductive paste (NCP) or a non-conductive film (NCF). The specified combination of epoxy resins, even in such a situation, makes the adhesive agent unlikely to swell upon exposure to ink and thus free of the poor electrical continuity issue.

Furthermore, the combination of epoxy resins according to an aspect of the invention can be used not only to join the flow channel substrate 10 and the COF substrates 410 described above but also at other mounts in a liquid ejecting apparatus, having similar effects.

Example 1

Epoxy adhesive agents were prepared with 5 to 10% by mass of p-aminophenol epoxy resin, 5 to 10% by mass of bisphenol A epoxy resin, 45 to 50% by mass of bisphenol F epoxy resin, and 30 to 40% by mass of an aliphatic polyamine hardener.

Example 2

Epoxy adhesive agents were prepared with 6 to 10% by mass of p-aminophenol epoxy resin, 2 to 5% by mass of bisphenol A epoxy resin, 30 to 40% by mass of bisphenol F epoxy resin, and 20 to 30% by mass of an aliphatic polyamine hardener.

Example 3

Epoxy adhesive agents were prepared with 20 to 25% by mass of p-aminophenol epoxy resin, 10 to 15% by mass of bisphenol A epoxy resin, 40 to 50% by mass of bisphenol F epoxy resin, and 10 to 20% by mass of an aliphatic polyamine hardener.

Comparative Example

Epoxy adhesive agents were prepared using 40% by mass of bisphenol A epoxy resin and 40 to 50% by mass of an aliphatic polyamine hardener.

Test 1

Samples of the materials obtained by hardening the epoxy adhesive agents of Examples 1 to 3 and Comparative Example were immersed in an organic solvent ink for 144 hours (6 days). The percent weight increase was then measured for each immersed sample.

The results were as follows: Example 1, 0.25%; Example 2, 0.90%; Example 3, 3.43%; Comparative Example, 40 to 50%. The swelling ratios of the epoxy adhesive agents of Examples 1 to 3 for contact with ink were therefore less than 1/10 of those of the adhesive agents of Comparative Example. This is believed to be because the base compound of the adhesive agents of Examples contained p-aminophenol epoxy resin, bisphenol A epoxy resin, and bisphenol F epoxy resin. More specifically, the results revealed that it is good to use 5 to 25% by mass of p-aminophenol epoxy resin, 2 to 15% by mass of bisphenol A epoxy resin, and 30 to 50% by mass of bisphenol F epoxy resin. However, the adhesive agents of Example 3, which contained 20 to 25% by mass of p-aminophenol epoxy resin, exhibited a somewhat higher swelling ratio than those of Examples 1 and 2, indicating that it is more preferred to use 5 to 10% by mass of p-aminophenol epoxy resin, 2 to 10% by mass of bisphenol A epoxy resin, and 30 to 50% by mass of bisphenol F epoxy resin and 20 to 40% by mass of a hardener. The swelling ratios of the epoxy adhesive agents prepared with this formula were on the order of 1/100 of those of the adhesive agents of Comparative Example.

Test 2

COF substrates 410 were bonded to a flow channel substrate 10 using an anisotropic conductive material containing an epoxy adhesive agent of Example 1, and the obtained article was used to assemble a recording head. Another recording head was assembled using an anisotropic conductive material containing an epoxy adhesive agent of Comparative Example. The two recording heads were subjected to an accelerated test, in which the recording heads were left in an ink-saturated atmosphere at 60° C. to simulate long-term use conditions.

After the accelerated test, the recording heads were subjected to electrical continuity checks in their individual segments. The recording head produced using an adhesive agent of Comparative Example had lost electrical continuity in some segments, while that produced using an adhesive agent of Example 1 had not.

Other Embodiments

Although in the above embodiment the pressure chambers 12 are arranged in two rows on the flow channel substrate 10, the number of rows in this context is not limited; it is possible to arrange them in one row or separate them into three or more rows. When they are arranged in two or more rows, at least a pair of two rows is formed to face each other.

Furthermore, although in the above embodiment the conductive particles are crushed by using the support 400 and some related components, it is also possible that the conductive particles are crushed by any means other than a support and then the wiring substrates are fastened to a support.

In the above embodiment, the drivers 120 are mounted using the support 400. In order to avoid using wire bonding and to achieve a high packing density, however, it is enough that the support 400 holds the wiring substrates connected to the lead electrodes 90 perpendicular to the plane on which the lead electrodes 90 are formed. There are no particular restrictions on the shape and other characteristics of the support 400 as long as it is able to support the wiring substrates as desired, and examples of possible shapes of it include a lattice and a raft. If the conductive particles are compressed by using a support, however, it is desired that the bottom surface of the support be flat so that the pressure can be equalized. The drivers 120 may be mounted directly on the support 400 and the wiring substrates may be connected to the surface of these drivers 120 in another possible configuration. In this case, the bottom of each wiring substrate is folded away from the support 400 and connected to the corresponding set of lead electrodes 90.

The material of the flow channel substrate 10 and other components is not limited to that specified in the above embodiment either.

In addition, while the above embodiment is directed to an ink jet recording head as a typical liquid ejecting head, the invention may cover many other kinds of liquid ejecting heads including ones not used with ink, of course.

The term actuator, as used in the invention, refers to any device that can convert the energy it receives into another form of energy. Examples include actuators that convert electric energy into mechanical energy, such as piezoelectric actuators, and actuators that convert electric energy into heat energy, such as thermal actuators. All of these are included in the term actuator, as used in the invention.

Besides ink jet recording heads, examples of liquid ejecting heads covered by the invention include recording heads for printers and other kinds of image recording apparatus, colorant ejecting heads for manufacturing color filters for liquid crystal displays and other kinds of displays, electrode material ejecting heads for forming electrodes for organic EL displays, field emission displays (FEDs), and other kinds of displays, and bioorganic substance ejecting heads for manufacturing biochips.

Figure 4:
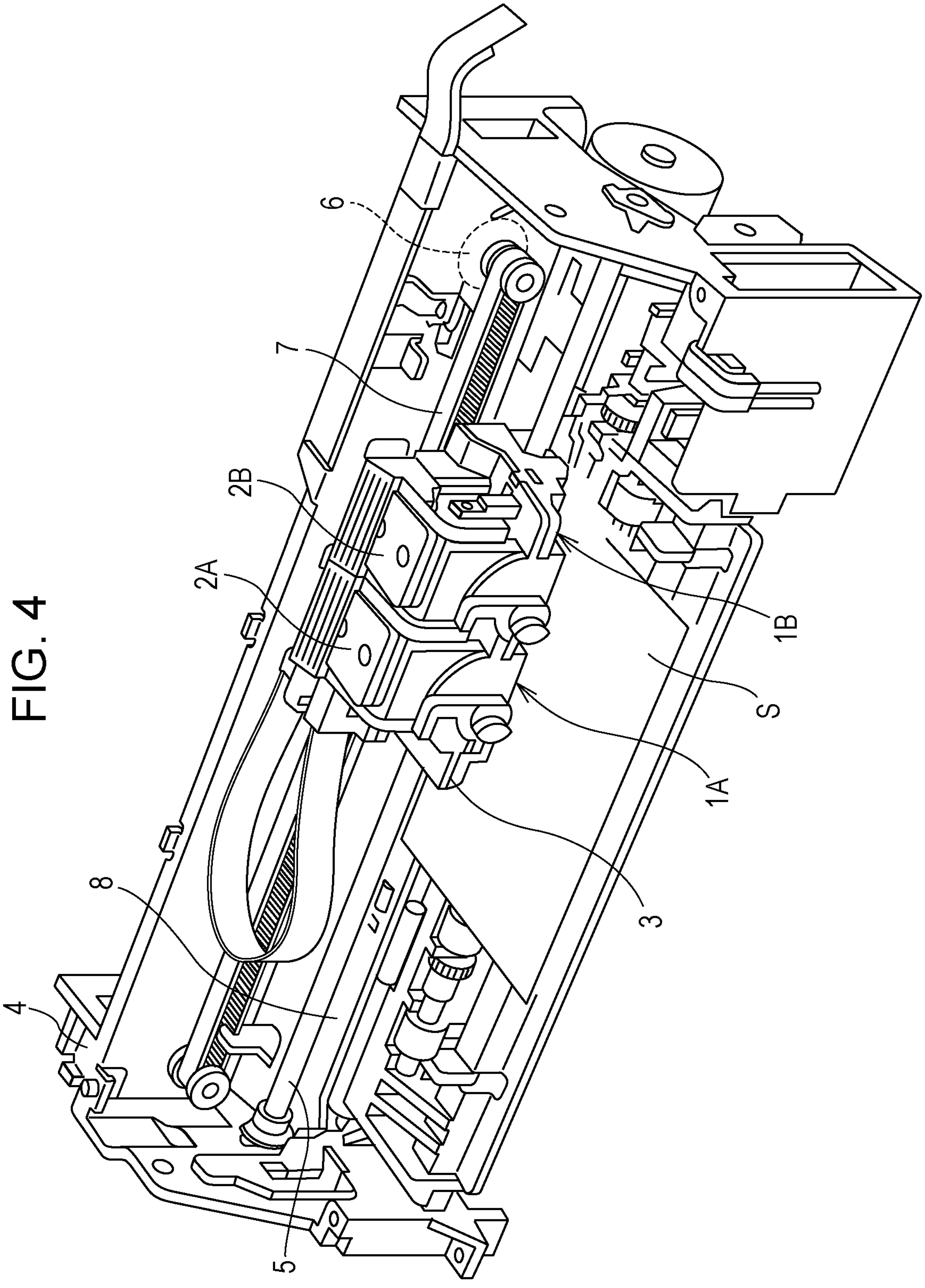
FIG. 4 is a perspective diagram illustrating a liquid ejecting apparatus having the recording head mentioned above.

Ink jet recording heads according to the above embodiment can be installed in ink jet recording apparatuses as a component of their recording head units each having an ink channel communicating with an ink cartridge or any other kind of ink container. FIG. 4 schematically illustrates an ink jet recording apparatus of this type. As can be seen from the drawing, the recording head units 1A and 1B, which are each equipped with the ink jet recording head I according to the above embodiment, carry detachable ink supply cartridges 2A and 2B, respectively. The carriage 3 for these recording head units 1A and 1B can move along a carriage shaft 5 installed in the main body 4. In a typical constitution, the recording head unit 1A discharges a black ink composition, whereas the recording head unit 1B discharges a color ink composition.

Once the motor 6 is activated, the generated driving force is transmitted through gears (not illustrated) and a timing belt 7 to the carriage 3. As a result, the carriage 3 and the recording head units 1A and 1B supported thereby move along the carriage shaft 5. The main body 4 also has a platen 8 extending along the carriage shaft 5; rollers or some other kind of feeding mechanism (not illustrated) feeds a recording sheet S (paper or some other kind of recording medium), which is then transported by the platen 8. The motor 6, the pressure generator for the recording head units 1A and 1B, and other mechanisms involved operate under control of a control unit (not illustrated) having components such as a CPU and a memory.

The entire disclosure of Japanese Patent Application No. 2012-074300, filed Mar. 28, 2012 is expressly incorporated by reference herein.

What is claimed is:

1. A liquid ejecting head comprising:

a flow channel substrate;

an actuator formed on the flow channel substrate and having at least one mount; and a flexible wiring substrate electrically connected to the mount to supply a drive signal to the actuator, wherein:

the mount of the actuator and the wiring substrate are bonded together using an epoxy adhesive agent containing p-aminophenol epoxy resin, bisphenol A epoxy resin, and bisphenol F epoxy resin.

2. The liquid ejecting head according to claim 1, wherein the epoxy adhesive agent contains 5 to 25% by mass of p-aminophenol epoxy resin, 2 to 15% by mass of bisphenol A epoxy resin, 30 to 50% by mass of bisphenol F epoxy resin, and a hardener.

3. The liquid ejecting head according to claim 1, wherein the epoxy adhesive agent is an anisotropic conductive material that exhibits anisotropic conductivity owing to a particulate conductor contained therein.

4. A liquid ejecting apparatus comprising the liquid ejecting head according to claim 1.

5. A liquid ejecting apparatus comprising the liquid ejecting head according to claim 2.

6. A liquid ejecting apparatus comprising the liquid ejecting head according to claim 3.

7. The liquid ejecting head according to claim 1, wherein the mount is electrically conductive.

8. The liquid ejecting head according to claim 1, further comprising a driver connected to the wiring substrate, the driver being configured to supply a drive signal to the actuator.

* * * * *